US010622326B2

(12) United States Patent
Yang et al.

(10) Patent No.: US 10,622,326 B2
(45) Date of Patent: Apr. 14, 2020

(54) CHIP PACKAGE STRUCTURE

(71) Applicants: Industrial Technology Research Institute, Hsinchu (TW); Intellectual Property Innovation Corporation, Hsinchu (TW)

(72) Inventors: Chen-Tsai Yang, Taoyuan (TW); Ko-Chin Yang, Taipei (TW); Jui-Chang Chuang, Kaohsiung (TW); Yen-Ting Wu, Taoyuan (TW); Chia-Hua Lu, Miaoli County (TW)

(73) Assignees: Industrial Technology Research Institute, Hsinchu (TW); Intellectual Property Innovation Corporation, Hsinchu (TW)

( * ) Notice: Subject to any disclaimer, the term of this patent is extended or adjusted under 35 U.S.C. 154(b) by 0 days.

(21) Appl. No.: 15/911,183

(22) Filed: Mar. 5, 2018

(65) Prior Publication Data

US 2019/0057948 A1 Feb. 21, 2019

Related U.S. Application Data

(60) Provisional application No. 62/547,120, filed on Aug. 18, 2017.

(30) Foreign Application Priority Data

Dec. 4, 2017 (TW) .............................. 106142438 A

(51) Int. Cl.
*H01L 23/00* (2006.01)
*H01L 21/56* (2006.01)
(Continued)

(52) U.S. Cl.
CPC ............ *H01L 24/17* (2013.01); *H01L 21/561* (2013.01); *H01L 21/568* (2013.01);
(Continued)

(58) Field of Classification Search
None
See application file for complete search history.

(56) References Cited

U.S. PATENT DOCUMENTS 7,183,878 B2 * 2/2007 Kushitani ............ H03H 9/0576
333/133
7,185,426 B1 * 3/2007 Hiner .................. H01L 21/4857
257/687
(Continued)

FOREIGN PATENT DOCUMENTS

CN  102326245  1/2012
CN  102376595  3/2012
(Continued)

OTHER PUBLICATIONS

"Office Action of Taiwan Counterpart Application, application No. 106142438", dated Oct. 8, 2018, with English translation thereof, p. 1-p. 16.
(Continued)

*Primary Examiner* — David E Graybill
(74) *Attorney, Agent, or Firm* — JCIPRNET

(57) ABSTRACT

A chip package structure includes a chip package layer and at least one conductive structure layer. The chip package layer includes at least one chip and an encapsulant. The chip has an upper surface, and the encapsulant is used to encapsulate the chip and expose the upper surface. The conductive structure layer includes a plurality of first conductive pillars and a plurality of second conductive pillars. The first conductive pillars are disposed on the upper surface, the second conductive pillars are disposed on the upper surface and located between an edge of the upper surface and the first conductive pillars. A density of the second conductive pillars along an extending direction of the edge is greater than or
(Continued)

equal to 1.2 times of a density of the first conductive pillars along the extending direction of the edge.

15 Claims, 10 Drawing Sheets

(51) Int. Cl.
    *H01L 23/31*     (2006.01)
    *H01L 23/538*     (2006.01)
    *H01L 25/065*     (2006.01)
    *H01L 23/552*     (2006.01)

(52) U.S. Cl.
    CPC ...... *H01L 23/3114* (2013.01); *H01L 23/3121* (2013.01); *H01L 23/5386* (2013.01); *H01L 24/14* (2013.01); *H01L 25/0652* (2013.01); *H01L 25/0657* (2013.01); *H01L 23/552* (2013.01); *H01L 24/13* (2013.01); *H01L 24/16* (2013.01); *H01L 24/81* (2013.01); *H01L 24/97* (2013.01); *H01L 2224/13144* (2013.01); *H01L 2224/13147* (2013.01); *H01L 2224/13178* (2013.01); *H01L 2224/14132* (2013.01); *H01L 2224/14152* (2013.01); *H01L 2224/1713* (2013.01); *H01L 2224/17177* (2013.01); *H01L 2224/81005* (2013.01); *H01L 2224/97* (2013.01); *H01L 2225/06517* (2013.01); *H01L 2225/06548* (2013.01)

(56) References Cited

U.S. PATENT DOCUMENTS

| | | | | |
|---|---|---|---|---|
| 7,548,430 B1* | 6/2009 | Huemoeller | ........ | H01L 21/4857 361/760 |
| 8,362,610 B2* | 1/2013 | Fukuda | .................. | H01L 24/14 257/737 |
| 8,436,255 B2* | 5/2013 | Goh | ...................... | H01L 21/563 174/256 |
| 8,466,997 B2* | 6/2013 | Goh | .................. | H01L 27/14618 257/684 |
| 8,502,394 B2* | 8/2013 | Goh | .................. | H01L 25/0657 257/777 |
| 8,664,044 B2* | 3/2014 | Jin | .................... | H01L 21/76283 257/700 |
| 8,772,947 B2* | 7/2014 | Lee | .................. | H01L 21/76898 257/690 |
| 8,860,207 B2* | 10/2014 | Jin | .................... | H01L 21/76283 257/706 |
| 8,884,422 B2* | 11/2014 | Goh | ........................ | H01L 25/16 257/686 |
| 8,890,269 B2* | 11/2014 | Luan | ................. | H01L 27/14618 257/434 |
| 8,916,481 B2* | 12/2014 | Gan | ...................... | H01L 25/105 438/127 |
| 9,053,989 B2* | 6/2015 | Kuo | ........................ | H01L 24/14 |
| 9,257,396 B2* | 2/2016 | Uzoh | ........................ | H01L 24/02 |
| 9,691,634 B2* | 6/2017 | Koelling | ............... | B22F 1/0014 |
| 2003/0082846 A1* | 5/2003 | Yoneda | ............... | H01L 21/6835 438/106 |
| 2003/0156402 A1* | 8/2003 | Ding | .................. | H01L 23/5389 361/820 |
| 2008/0302481 A1* | 12/2008 | Berger | .................... | B32B 37/06 156/712 |
| 2010/0090333 A1* | 4/2010 | Hayashi | ............ | H01L 23/49838 257/693 |
| 2011/0095418 A1* | 4/2011 | Lim | .................... | H01L 23/3128 257/737 |
| 2011/0156230 A1* | 6/2011 | Goh | .................... | H01L 25/0657 257/686 |
| 2011/0156240 A1* | 6/2011 | Luan | ....................... | H01L 24/19 257/692 |
| 2011/0156250 A1* | 6/2011 | Goh | ......................... | H01L 25/16 257/738 |
| 2011/0157452 A1* | 6/2011 | Goh | .................. | H01L 27/14618 348/340 |
| 2011/0157853 A1* | 6/2011 | Goh | ....................... | H01L 21/563 361/783 |
| 2011/0248398 A1* | 10/2011 | Parvarandeh | ........... | H01L 24/06 257/737 |
| 2012/0038053 A1* | 2/2012 | Oh | ......................... | H01L 21/561 257/773 |
| 2012/0098120 A1* | 4/2012 | Yu | ........................... | H01L 24/13 257/737 |
| 2013/0049217 A1* | 2/2013 | Gong | ................ | H01L 23/49822 257/774 |
| 2013/0062755 A1* | 3/2013 | Kuo | ........................ | H01L 24/14 257/737 |
| 2013/0105982 A1* | 5/2013 | Jin | .................... | H01L 21/76283 257/773 |
| 2013/0105991 A1* | 5/2013 | Gan | ....................... | H01L 25/105 257/777 |
| 2013/0175694 A1* | 7/2013 | Shih | ....................... | H01L 21/568 257/773 |
| 2013/0223014 A1* | 8/2013 | Lin | ....................... | B23K 1/0016 361/728 |
| 2013/0256883 A1* | 10/2013 | Meyer | ..................... | H01L 24/20 257/738 |
| 2013/0320471 A1* | 12/2013 | Luan | ................. | H01L 27/14618 257/432 |
| 2014/0057394 A1* | 2/2014 | Ramasamy | ........... | H01L 21/561 438/113 |
| 2014/0151877 A1* | 6/2014 | Lim | .................... | H01L 23/3128 257/737 |
| 2014/0191387 A1* | 7/2014 | Jin | .................... | H01L 21/76283 257/712 |
| 2017/0032977 A1* | 2/2017 | Chen | .................... | H01L 21/4857 |
| 2017/0229426 A1* | 8/2017 | Hung | ........................ | H01L 25/50 |
| 2018/0053665 A1* | 2/2018 | Kuo | ........................ | H01L 21/561 |
| 2018/0061812 A1* | 3/2018 | Lee | ......................... | H01L 25/50 |
| 2018/0247916 A1* | 8/2018 | Lee | .................... | H01L 25/0657 |
| 2018/0366535 A1* | 12/2018 | Chong | .................... | H01L 24/05 |
| 2019/0057948 A1* | 2/2019 | Yang | ........................ | H01L 24/17 |

FOREIGN PATENT DOCUMENTS

| | | | | |
|---|---|---|---|---|
| CN | | 103378041 | 10/2013 | |
| CN | | 102856329 | 2/2015 | |
| CN | | 205961561 | 2/2017 | |
| EP | | 3291295 A1 * | 3/2018 | ......... H01L 21/4853 |
| TW | | 201132261 | 9/2011 | |
| TW | | 201431028 | 8/2014 | |
| TW | | 201444039 | 11/2014 | |
| TW | | I480987 | 4/2015 | |
| TW | | 201530720 | 8/2015 | |
| TW | | I503930 | 10/2015 | |
| TW | | 201541583 | 11/2015 | |
| TW | | I521660 | 2/2016 | |
| TW | | 201618196 | 5/2016 | |
| TW | | 201618241 | 5/2016 | |
| TW | | I594382 | 8/2017 | |

OTHER PUBLICATIONS

"Office Action of Taiwan Related Application, application No. 106138776", dated Jun. 5, 2018, with English translation thereof, p. 1-p. 7.

\* cited by examiner

CHIP PACKAGE STRUCTURE

CROSS-REFERENCE TO RELATED APPLICATION

This application claims the priority benefits of U.S. provisional application Ser. No. 62/547,120, filed on Aug. 18, 2017 and Taiwan application serial no. 106142438, filed on Dec. 4, 2017. The entirety of each of the above-mentioned patent applications is hereby incorporated by reference herein and made a part of this specification.

TECHNICAL FIELD

The disclosure relates to a chip package structure.

BACKGROUND

In recent years, the semiconductor-related industries gradually advance along with growing demand for more power functions, faster signal transmission speeds, and increasing density of circuit elements of the electronic products. In the semiconductor package manufacturing process adopted by the semiconductor industry, the unsingulated chip package structure is formed on a temporary substrate, and the chip package structure is then separated from the substrate. Specifically, one end (hereinafter, "lift-off end") of the substrate may be pulled up to be lifted off from the chip package structure. Besides, one end (hereinafter, "lift-off end") of the chip package structure may also be pulled up to be lifted off from the substrate. In the foregoing lift-off process, the substrate (or the chip package structure) is gradually lifted off from the chip package structure (or the substrate) from the lift-off end toward the other end. As regards the conductive pillars between each of the chips and the redistribution layer in the chip package structure, the conductive pillars on each of the chips that are most adjacent to the lift-off end are subjected to greater lift-off stress in the foregoing lift-off process and thus are more likely to be damaged.

SUMMARY

In an embodiment of the disclosure, a chip package structure includes a chip package layer and at least one conductive structure layer. The chip package layer includes at least one chip and an encapsulant. The chip has an upper surface, and the encapsulant encapsulates the chip and exposes the upper surface. The conductive structure layer includes a plurality of first conductive pillars and a plurality of second conductive pillars. The first conductive pillars are disposed on the upper surface, the second conductive pillars are disposed on the upper surface and located between an edge of the upper surface and the first conductive pillars. A density of the second conductive pillars along an extending direction of the edge is greater than or equal to 1.2 times of a density of the first conductive pillars along the extending direction of the edge.

In an embodiment of the disclosure, a chip package structure includes a chip package layer and at least one conductive structure layer. The chip package layer includes at least one chip and an encapsulant. The chip has a first upper surface, and the encapsulant encapsulates the chip and exposes the first upper surface. The encapsulant has a second upper surface, and the first upper surface and the second upper surface are coplanar. The conductive structure layer includes a plurality of first conductive pillars and a plurality of second conductive pillars. The first conductive pillars are disposed on the first upper surface, and the second conductive pillars are disposed on the second upper surface and located outside the chip. An edge of the first upper surface is located between the second conductive pillars and the first conductive pillars, and the second conductive pillars are arranged along an extending direction of the edge.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

Figure 1A:
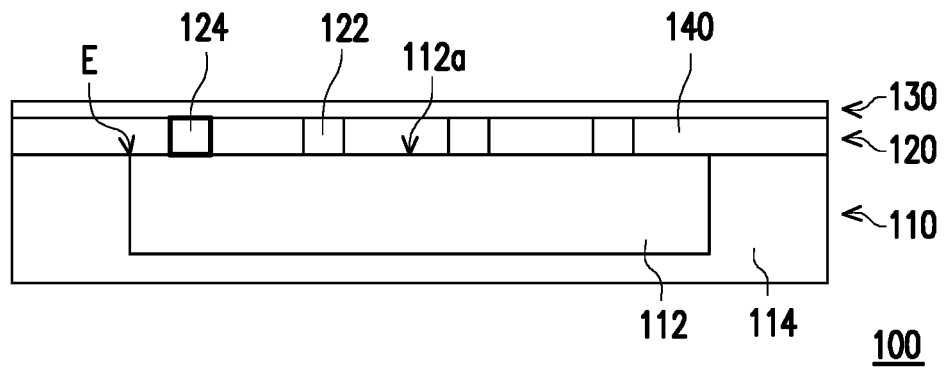
FIG. 1A is a cross-sectional view of a chip package structure according to an exemplary embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
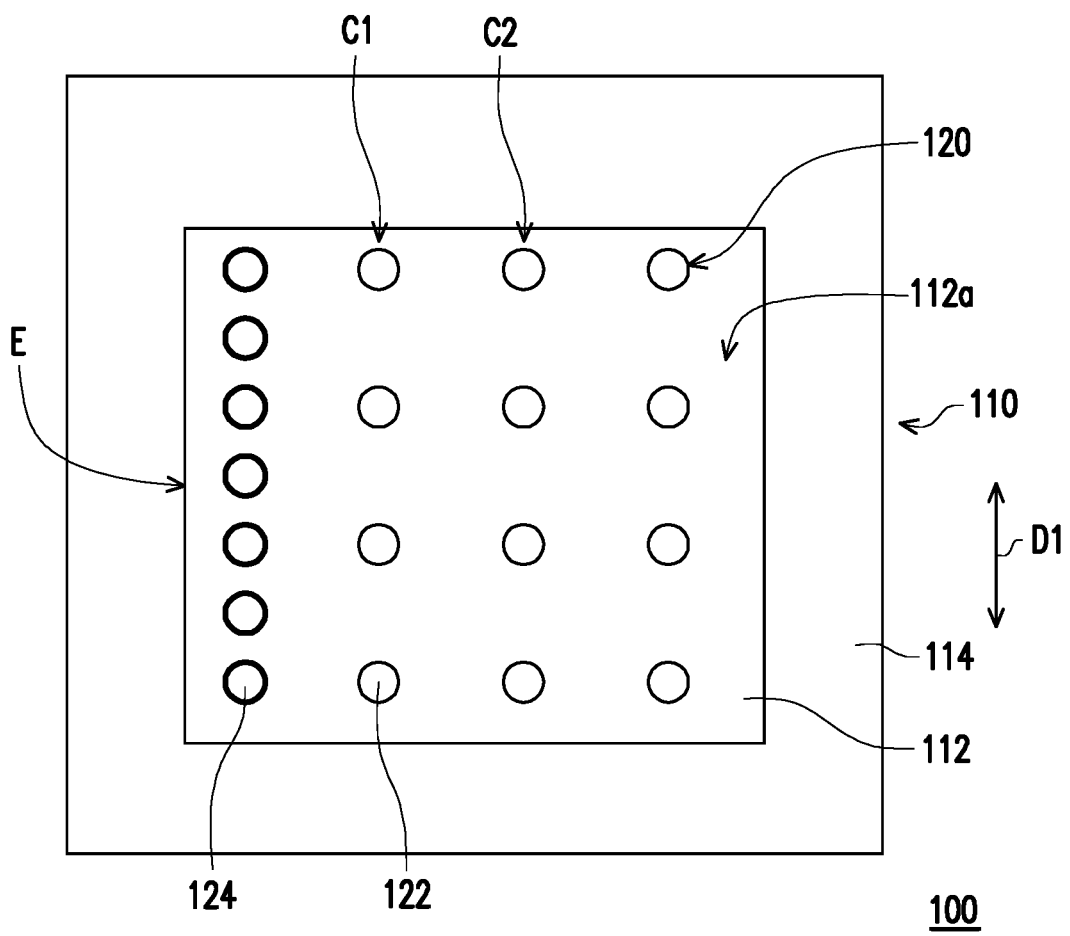
FIG. 1B is a top view of a partial structure of the chip package structure of FIG. 1A.

FIG. 1A is a cross-sectional view of a chip package structure according to an exemplary embodiment of the disclosure. FIG. 1B is a top view of a partial structure of the chip package structure of FIG. 1A. In order to have a clearer figure, a redistribution layer 130 and an under fill material 140 of FIG. 1A are not illustrated in FIG. 1B. With reference to FIG. 1A and FIG. 1B, a chip package structure 100 of this embodiment includes a chip package layer 110, a conductive structure layer 120, and the redistribution layer 130. The chip package layer 110 includes a chip 112 and an encapsulant 114. The chip 112 has an upper surface 112a, and the encapsulant 114 is used to encapsulate the chip 112 and expose the upper surface 112a. The conductive structure layer 120 is disposed on the chip package layer 110. The redistribution layer 130 is disposed on the conductive structure layer 120 and is electrically connected to the chip 112 through the conductive structure layer 120.

The conductive structure layer 120 includes a plurality of first conductive pillars 122 and a plurality of second conductive pillars 124. The first conductive pillars 122 are disposed on the upper surface 112a of the chip 112, the second conductive pillars 124 are disposed on the upper surface 112a of the chip 112 and are located between an edge E of the upper surface 112a and the first conductive pillars 122. A density of the second conductive pillars 124 along an extending direction of the edge E is greater than or equal to 1.2 times of a density of the first conductive pillars 122 along the extending direction of the edge E. In an embodiment, the density of the second conductive pillars 124 along the extending direction of the edge E is greater than or equal to 1.75 times of the density of the first conductive pillars 122 along the extending direction of the edge E. The second conductive pillars 124 may thus have greater structural strength with such ratio. The first conductive pillars 122 and the second conductive pillars 124 may be copper, gold, iridium, and other suitable conductive materials, and the disclosure is not limited to the above.

Figure 2:
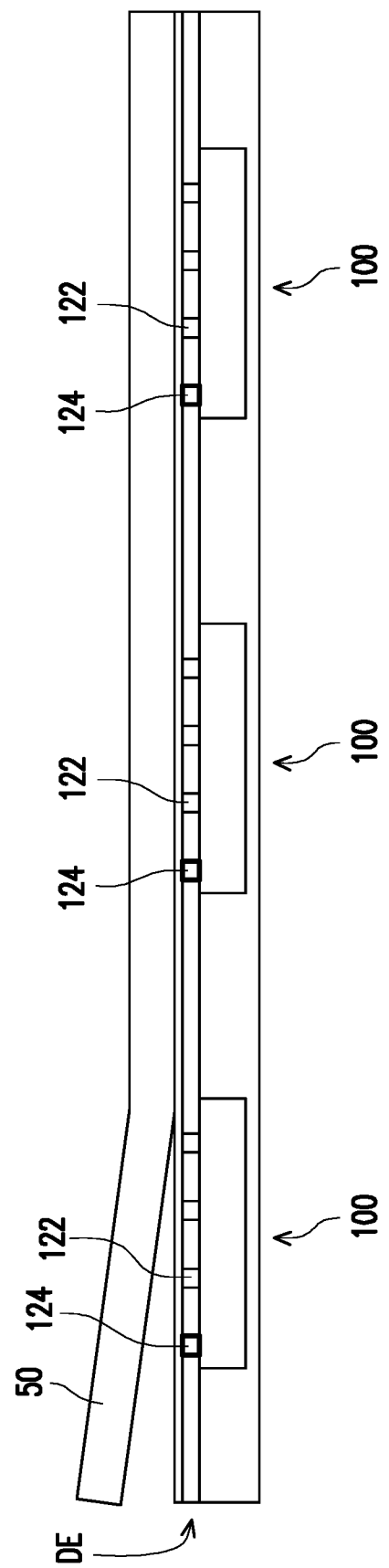
FIG. 2 illustrates an unsingulated chip package structure being separated from a substrate.

FIG. 2 illustrates an unsingulated chip package structure being separated from a substrate. Singulation refers to dividing the chip package structure shown in FIG. 2 into a plurality of chip package structure units through a cutting process or other suitable processes. The chip package structure 100 shown in FIG. 1A and FIG. 1B is one chip package structure unit. In a process of separating the unsingulated chip package structure 100 from a substrate 50 as shown in FIG. 2, the second conductive pillars 124 having greater structural strength may be placed to be closer to a lift-off end DE than the first conductive pillars 122 so as to be subjected to greater lift-off stress. As such, the first conductive pillars 122 and the second conductive pillars 124 are prevented from being damaged by the lift-off stress, and that reliability of the first conductive pillars 122 and the second conductive pillars 124 are enhanced. In an embodiment, the substrate 50 may be a flexible substrate, such as a thin glass substrate, a thin metal substrate, or a plastic substrate.

The first conductive pillars 122 constitute a first conductive pillar array as shown in FIG. 1B, and the second conductive pillars 124 are arranged along a column direction D1 of the first conductive pillar array. A first column C1 of the first conductive pillar array is located between the second conductive pillars 124 and a second column C2 of the first conductive pillar array. A density of the second conductive pillars 124 along the column direction D1 of the first conductive pillar array is greater than or equal to 1.2 times of a density of the first conductive pillars 122 of each of the columns of the first conductive pillar array along the column direction D1 of the first conductive pillar array. In an embodiment, the density of the second conductive pillars 124 along the column direction D1 of the first conductive pillar array is greater than or equal to 1.75 times of the density of the first conductive pillars 122 along the column direction D1 of the first conductive pillar array. The second conductive pillars 124 may thus have greater structural strength with such ratio. Nevertheless, the disclosure should not be construed as limited thereto. In other embodiments, the first conductive pillars 122 may be randomly arranged. Moreover, the density of the second conductive pillars 124 along the extending direction of the edge E is greater than or equal to 1.2 times of an average density of the first conductive pillars 122 along the extending direction of the edge E. In an embodiment, the density of the second conductive pillars 124 along the extending direction of the edge E is greater than or equal to 1.75 times of the density of the first conductive pillars 122 along the extending direction of the edge E. The second conductive pillars 124 may thus have greater structural strength with such ratio.

As shown in FIG. 1B, a number of the second conductive pillars 124 is greater than a number of the first conductive pillars 122 of each of the columns of the first conductive pillar array constituted by the first conductive pillars 122 in this embodiment. For instance, the number of the second conductive pillars 124 shown in FIG. 1B is seven, and this number is greater than the number of the first conductive pillars 122 (four is illustrated) of the first column C1 of the first conductive pillar array. That is, the second conductive pillars 124 are arranged with greater density through increasing the number of the second conductive pillars 124 in this embodiment, but the disclosure is not limited to the above. Alternatively, the second conductive pillars 124 may have a greater unit area density through increasing an outer diameter of each of the second conductive pillars 124.

As shown in FIG. 1A, the chip package structure 100 of this embodiment further includes the under fill material 140. The under fill material 140 is disposed between the chip package layer 110 and the redistribution layer 130 and is used to encapsulate the first conductive pillars 122 and the second conductive pillars 124.

The chip 112 is electrically connected to the first conductive pillars 122 in this embodiment, so as to be electrically connected to the redistribution layer 130 through the first conductive pillars 122. In addition, the second conductive pillars 124 may be grounded and is capable of blocking external electromagnetic interfering.

Figure 3:
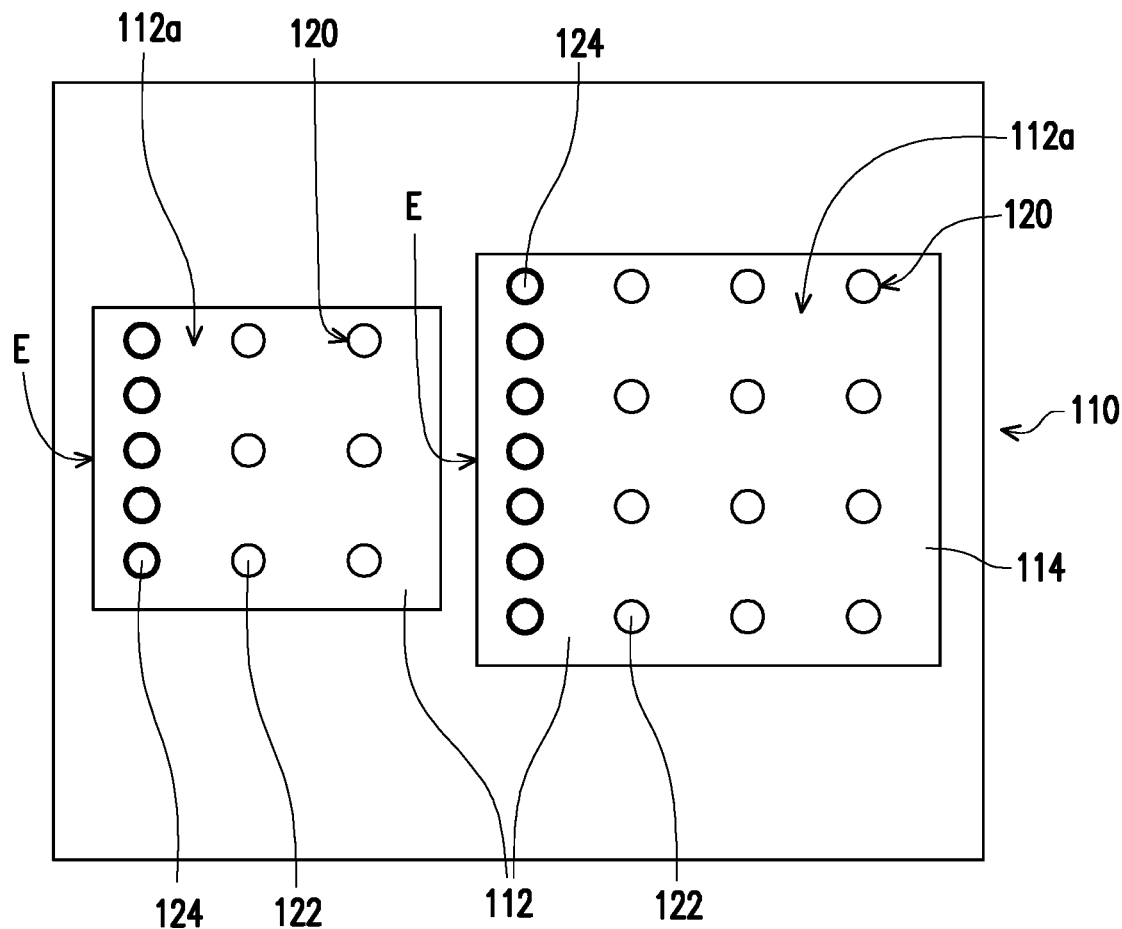
FIG. 3 is a top view of a partial structure of a chip package structure according to another exemplary embodiment of the disclosure.

FIG. 3 is a top view of a partial structure of a chip package structure according to another exemplary embodiment of the disclosure. A difference between the embodiment of FIG. 3 and the embodiment of FIG. 1B includes that in FIG. 3, a number of the chip 112 is plural (two are illustrated), a number of the conductive structure layer 120 is plural (two are illustrated), and the conductive structure layers 120 respectively correspond to the chips 112. Besides, sizes of the two chips 112 of FIG. 3 are different, for example. In other embodiments, the number and the sizes of the chips 112 may be other suitable number and sizes, and the disclosure is not limited to the above.

Figure 4:
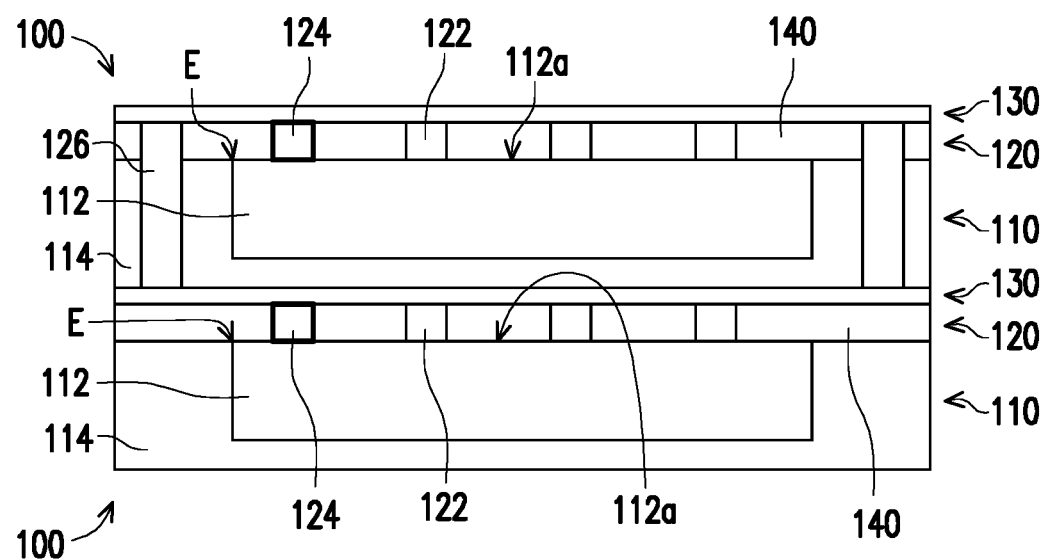
FIG. 4 is a cross-sectional view of a chip package structure according to another exemplary embodiment of the disclosure.
Figure 5:
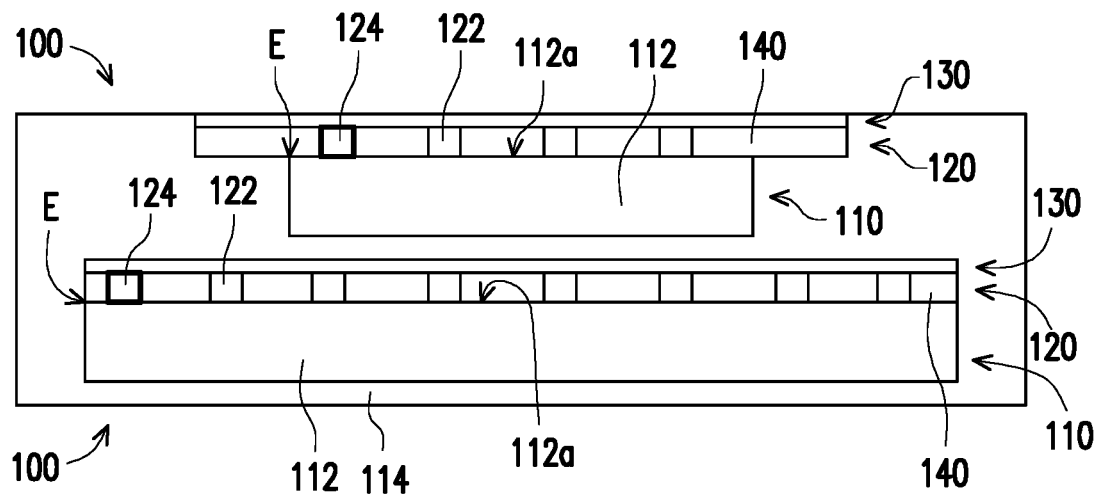
FIG. 5 is a cross-sectional view of a chip package structure according to another exemplary embodiment of the disclosure.

FIG. 4 is a cross-sectional view of a chip package structure according to another exemplary embodiment of the disclosure. A difference between the embodiment of FIG. 4 and the embodiment of FIG. 1A includes that the redistribution layer 130 of the chip package structure 100 carriers another one of the chip package structure 100 and thus constitutes a package on package (POP) module, wherein the two redistribution layers 130 are electrically connected to each other through third conductive pillars 126. FIG. 5 is a cross-sectional view of a chip package structure according to another exemplary embodiment of the disclosure. A difference between the embodiment of FIG. 5 and the embodiment of FIG. 4 includes that the chip 112 of the chip package structure 100 at a lower layer has a greater size and has a greater number of the first conductive pillars 122.

Figure 6A:
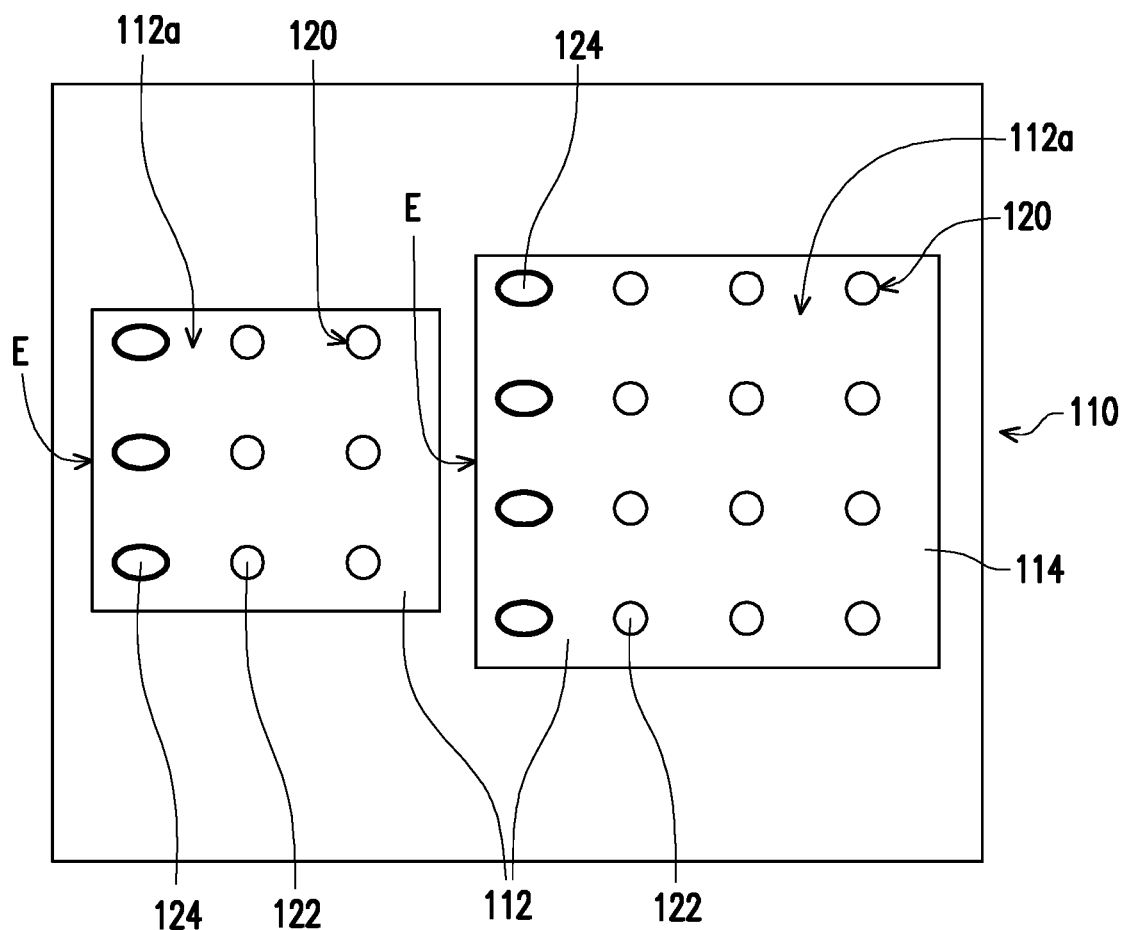
FIG. 6A is a schematic top view of a partial structure of a chip package structure according to another exemplary embodiment of the disclosure.

FIG. 6A is a schematic top view of a partial structure of a chip package structure according to another exemplary embodiment of the disclosure. A difference between the embodiment of FIG. 6A and the embodiment of FIG. 3 includes that the number of the second conductive pillars 124 is identical to the number of the first conductive pillars 122 of each of the columns in each of the conductive structure layers 120. That is, the second conductive pillars 124 are arranged with greater density not through increasing the number of the second conductive pillars 124 in the embodiment of FIG. 6A. In the embodiment of FIG. 6A, an outer diameter of each of the second conductive pillars 124 along a direction perpendicular to the edge E is greater than 1.2 times of an outer diameter of each of the first conductive pillars 122 along the direction perpendicular to the edge E. Moreover, the outer diameter of each of the second conductive pillars 124 along the direction perpendicular to the edge E is greater than 1.2 times of an outer diameter of each of the second conductive pillars 124 along a direction parallel to the edge E. That is, the second conductive pillars 124 have a greater unit area density through increasing the outer diameter of each of the second conductive pillars 124 in this embodiment, and thereby, the structural strength of each of the second conductive pillars 124 along the direction perpendicular to the edge E is increased.

Figure 6B:
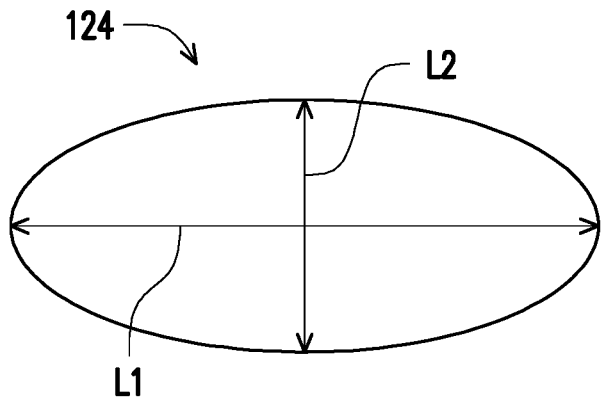
FIG. 6B illustrates the second conductive pillar of FIG. 6A.
Figure 7A:
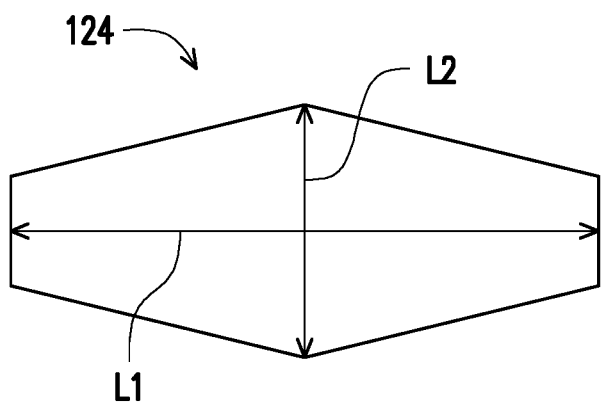
FIG. 7A and FIG. 7B illustrate the second conductive pillar of other exemplary embodiments of the disclosure.
Figure 7B:
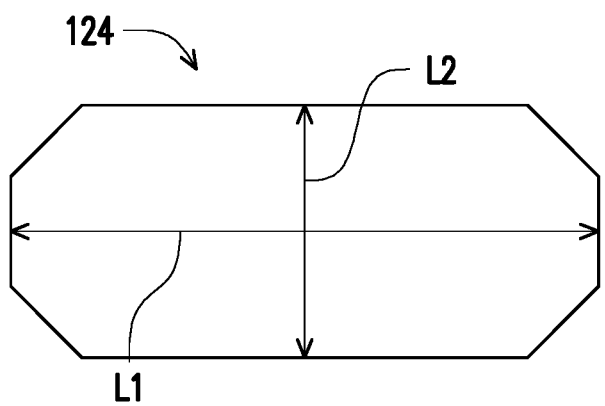

FIG. 6B illustrates the second conductive pillar of FIG. 6A. The second conductive pillar 124 may be an ellipse, and a length L1 of a major axis is 1.2 times greater than a length L2 of a short axis of the ellipse. FIG. 7A and FIG. 7B illustrate the second conductive pillar of other exemplary embodiments of the disclosure, wherein a ratio of the length L1 to the length L2 is identical to that shown in FIG. 6B. In other embodiments, the second conductive pillar 124 may shaped as a hexagon as shown in FIG. 7A, may be shaped as an octagon as shown in FIG. 7B, or may be shaped as other shapes, but the disclosure is not limited to the above.

In other embodiments, the second conductive pillar may extend to the outside of the chip for structural reinforcement, which is specifically described as follows.

Figure 8A:
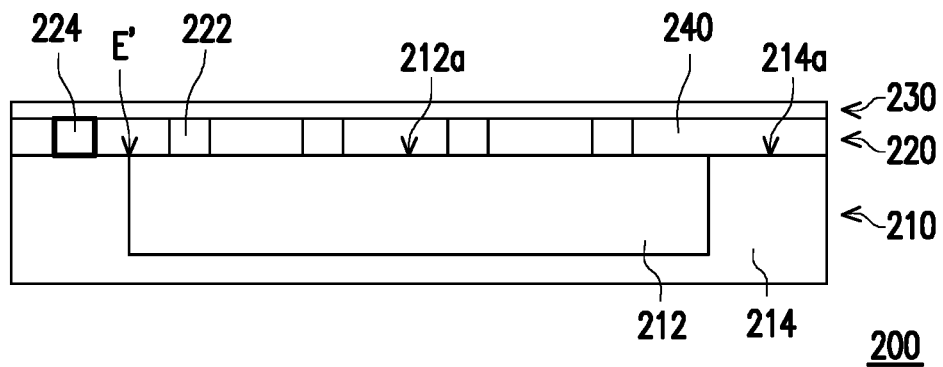
FIG. 8A is a cross-sectional view of a chip package structure according to another exemplary embodiment of the disclosure.
Figure 8B:
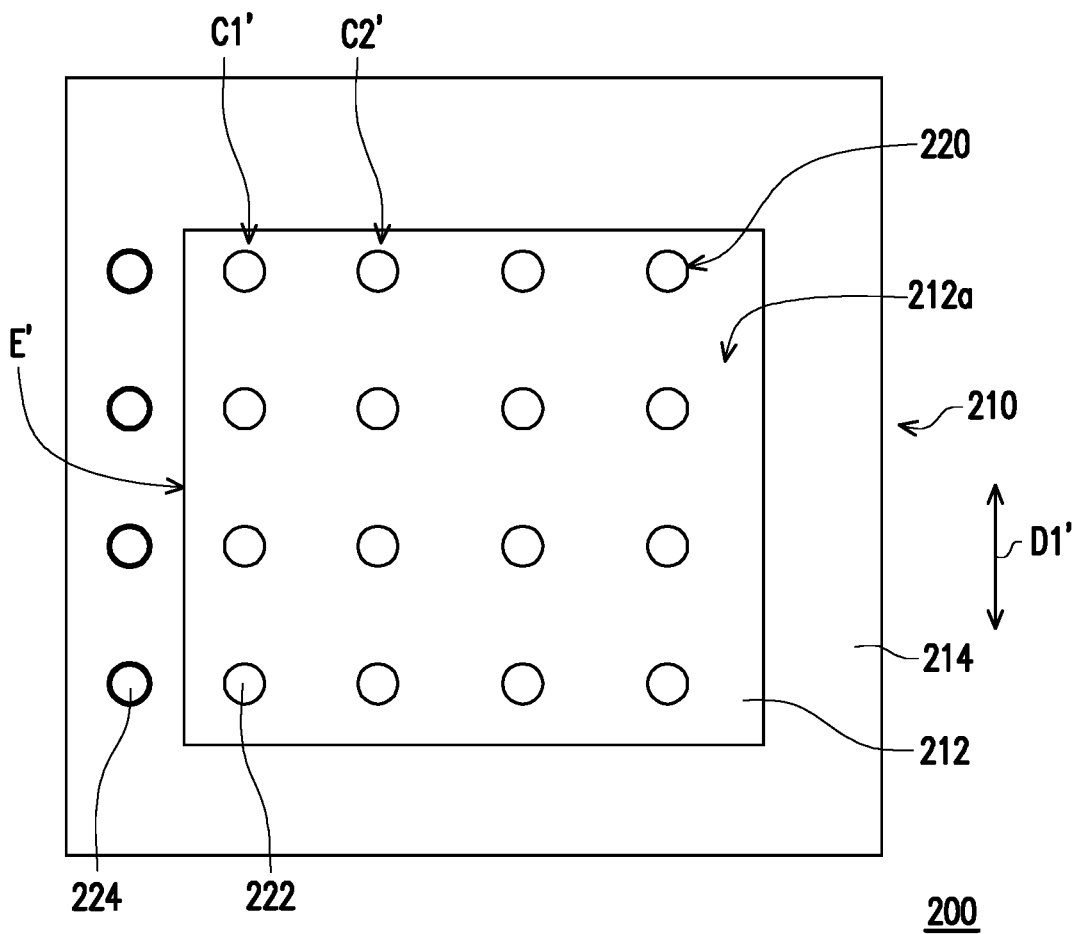
FIG. 8B is a top view of a partial structure of the chip package structure of FIG. 8A.

FIG. 8A is a cross-sectional view of a chip package structure according to another exemplary embodiment of the disclosure. FIG. 8B is a top view of a partial structure of the chip package structure of FIG. 8A. In order to have a clearer figure, a redistribution layer 230 and an under fill material 240 of FIG. 8A are not illustrated in FIG. 8B. With reference to FIG. 8A and FIG. 8B, a chip package structure 200 of this embodiment includes a chip package layer 210, a conductive structure layer 220, and the redistribution layer 230. The chip package layer 210 includes a chip 212 and an encapsulant 214. The chip 212 has a first upper surface 212a, and the encapsulant 214 is used to encapsulate the chip 212 and expose the first upper surface 212a. The encapsulant 214 has a second upper surface 214a, and the first upper surface 212a and the second upper surface 214a are coplanar. The conductive structure layer 220 is disposed on the chip package layer 210. The redistribution layer 230 is disposed on the conductive structure layer 220 and is electrically connected to the chip 212 through the conductive structure layer 220.

The conductive structure layer 220 includes a plurality of first conductive pillars 222 and a plurality of second conductive pillars 224. The first conductive pillars 222 are disposed on the first upper surface 212a of the chip 212, the second conductive pillars 224 are disposed on the second upper surface 214a of the encapsulant 214, meaning that the second conductive pillars 224 extend to the outside of the chip 212. An edge E' of the first upper surface of the chip 212 is located between the second conductive pillars 224 and the first conductive pillars 222, and the second conductive pillars 224 are arranged along an extending direction of the edge E'. That is, the second conductive pillars 224 are added pillars disposed outside the chip 212. The first conductive pillars 222 and the second conductive pillars 224 may be copper, gold, iridium, and other suitable conductive materials, and the disclosure is not limited to the above.

In a process of separating the unsingulated chip package structure 200 from a substrate, the second conductive pillars 224 may be placed to be closer to a lift-off end than the first conductive pillars 222, such that the lift-off stress is absorbed through the second conductive pillars 224. As such, the first conductive pillars 222 are prevented from being damaged by the lift-off stress, and that reliability of the first conductive pillars 222 is enhanced.

The first conductive pillars 222 constitute a first conductive pillar array as shown in FIG. 8B, and the second conductive pillars 224 are arranged along a column direction D1' of the first conductive pillar array. A first column C1' of the first conductive pillar array is located between the second conductive pillars 224 and a second column C2' of the first conductive pillar array. A distance between the second conductive pillars 224 and the first column C1' of the first conductive pillar array is equal to a distance between the first column C1' of the first conductive pillar array and the second column C2' of the first conductive pillar array, and the distances are, for example, 50 microns to 150 microns. Nevertheless, the disclosure should not be construed as limited thereto. In other embodiments, the first conductive pillars 222 may be randomly arranged.

As shown in FIG. 8A, the chip package structure 200 of this embodiment further includes the under fill material 240. The under fill material 240 is disposed between the chip package layer 210 and the redistribution layer 230 and is used to encapsulate the first conductive pillars 222 and the second conductive pillars 224.

The chip 212 is electrically connected to the first conductive pillars 222 in this embodiment, so as to be electrically connected to the redistribution layer 230 through the first conductive pillars 222. In addition, the second conductive pillars 224 may be grounded and is capable of blocking external electromagnetic interfering.

Before the redistribution layer 230 and the chip package layer 210 are bonded, the first conductive pillars 222 may be formed on the chip 212, and the second conductive pillars 224 may be manufactured together with the redistribution layer 230. Nevertheless, the disclosure should not be construed as limited thereto. Before the redistribution layer 230 and the chip package layer 210 are bonded, the first conductive pillars 222 and the second conductive pillars 224 may be manufactured together with the redistribution layer 230.

Figure 9:
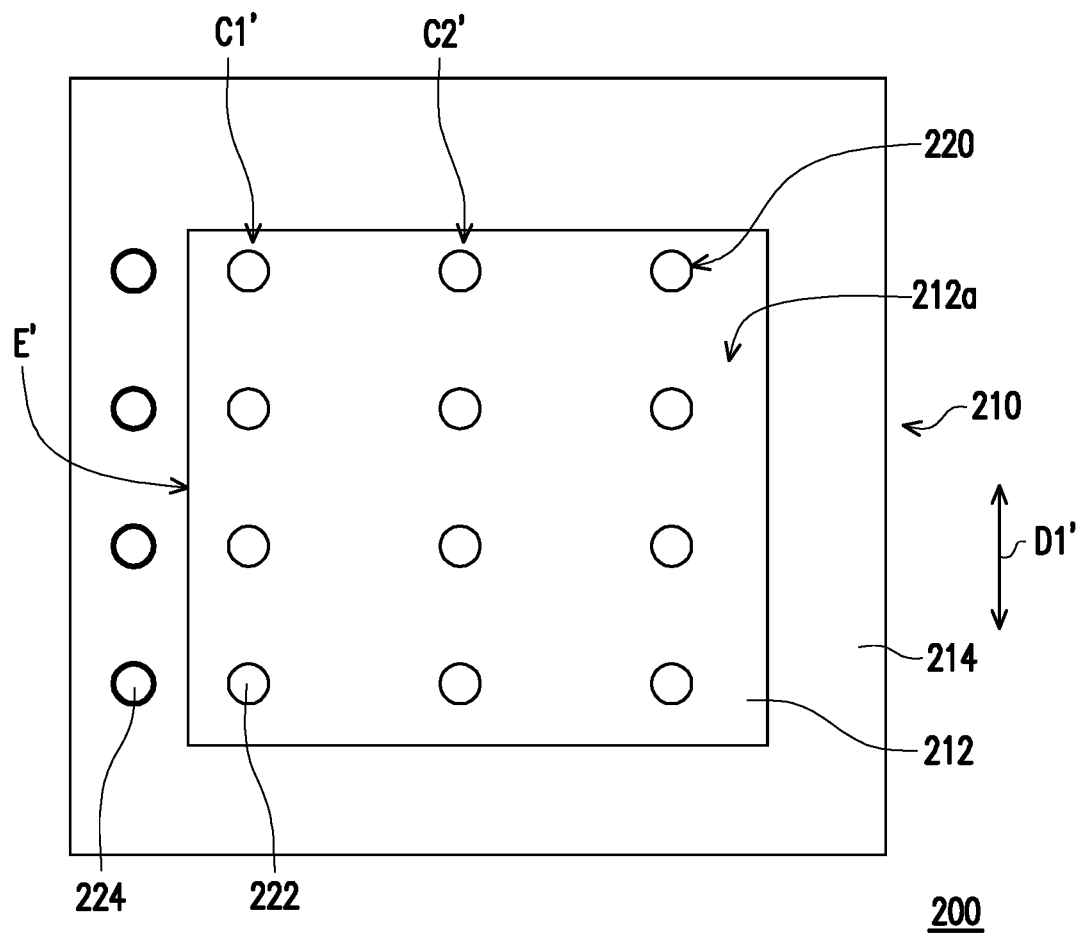
FIG. 9 is a top view of a partial structure of a chip package structure according to another exemplary embodiment of the disclosure.

FIG. 9 is a top view of a partial structure of a chip package structure according to another exemplary embodiment of the disclosure. A difference between the embodiment of FIG. 9 and the embodiment of FIG. 8B includes that the distance between the second conductive pillars 224 and the first column C1' of the first conductive pillar array constituted by the first conductive pillars 222 is less than the distance between the first column C1' of the first conductive pillar array and the second column C2' of the first conductive pillar array. That is, the second conductive pillars 224 are located closer to the first conductive pillar array and thereby are capable of effectively reducing the lift-off stress applied to the first conductive pillar array. For instance, when the distance between the first column C1' of the first conductive pillar array and the second column C2' of the first conductive pillar array is, for example, 150 microns, the distance between the second conductive pillars 224 and the first column C1' of the first conductive pillar array is, for example, greater than or equal to 50 microns and less than 150 microns.

Figure 10:
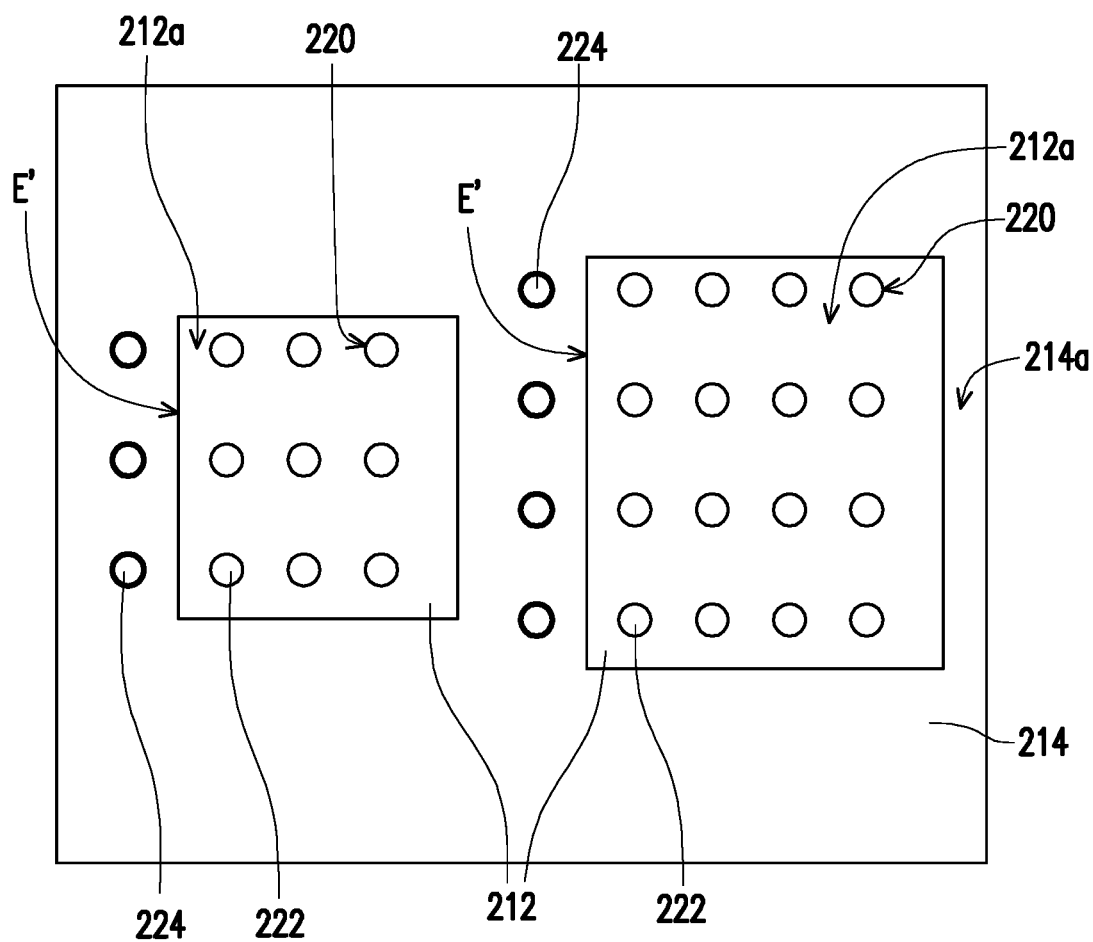
FIG. 10 is a top view of a partial structure of a chip package structure according to another exemplary embodiment of the disclosure.

FIG. 10 is a top view of a partial structure of a chip package structure according to another exemplary embodiment of the disclosure. A difference between the embodiment of FIG. 10 and the embodiment of FIG. 8B includes that in FIG. 10, a number of the chip 212 is plural (two are illustrated), a number of the conductive structure layer 220 is plural (two are illustrated), and the conductive structure layers 220 respectively correspond to the chips 212. Besides, sizes of the two chips 212 in FIG. 10 are different, for example. In other embodiments, the number and the sizes of the chips 212 may be other suitable number and sizes, and the disclosure is not limited to the above.

Figure 11:
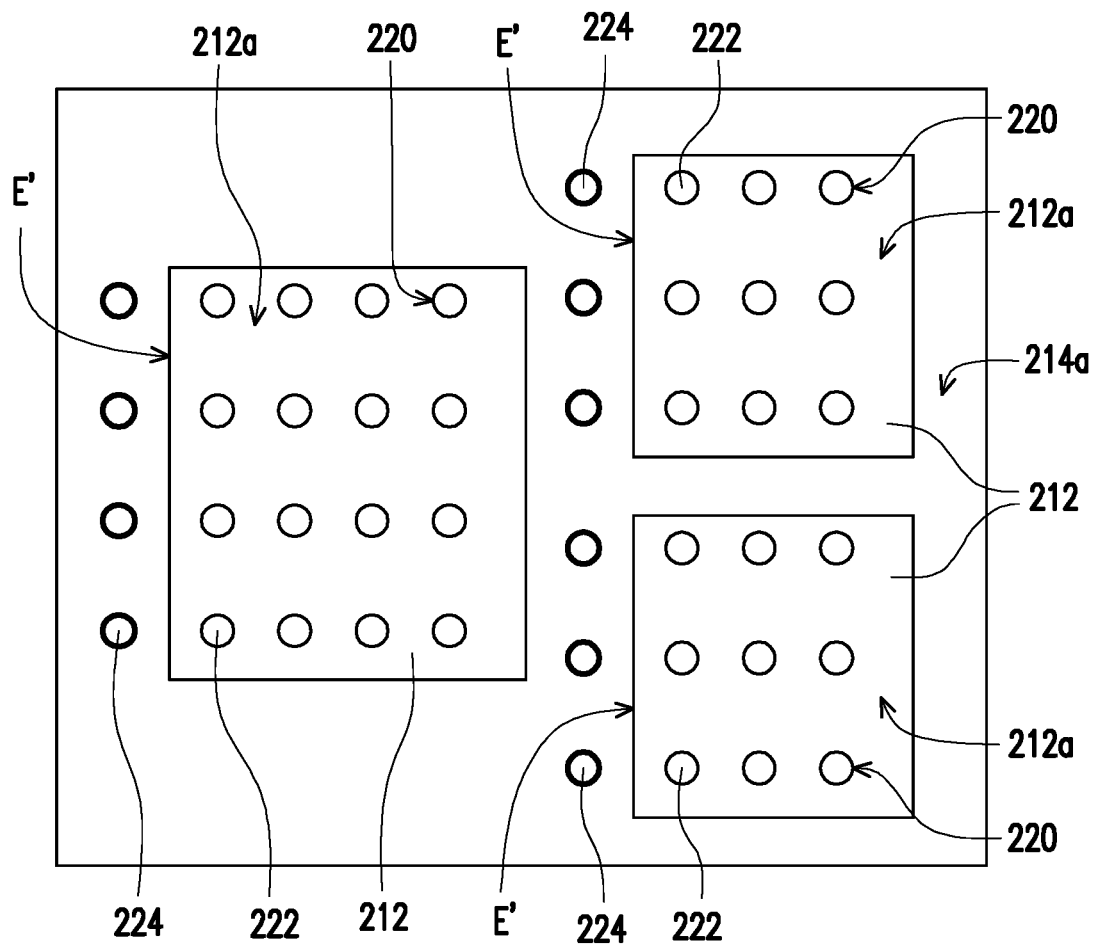
FIG. 11 is a top view of a partial structure of a chip package structure according to another exemplary embodiment of the disclosure.

FIG. 11 is a top view of a partial structure of a chip package structure according to another exemplary embodiment of the disclosure. A difference between the embodiment of FIG. 11 and the embodiment of FIG. 10 includes that in FIG. 11, the number of the chip 212 is three, the number of the conductive structure layer 220 is three, and the conductive structure layers 220 respectively correspond to the chips 212.

Figure 12:
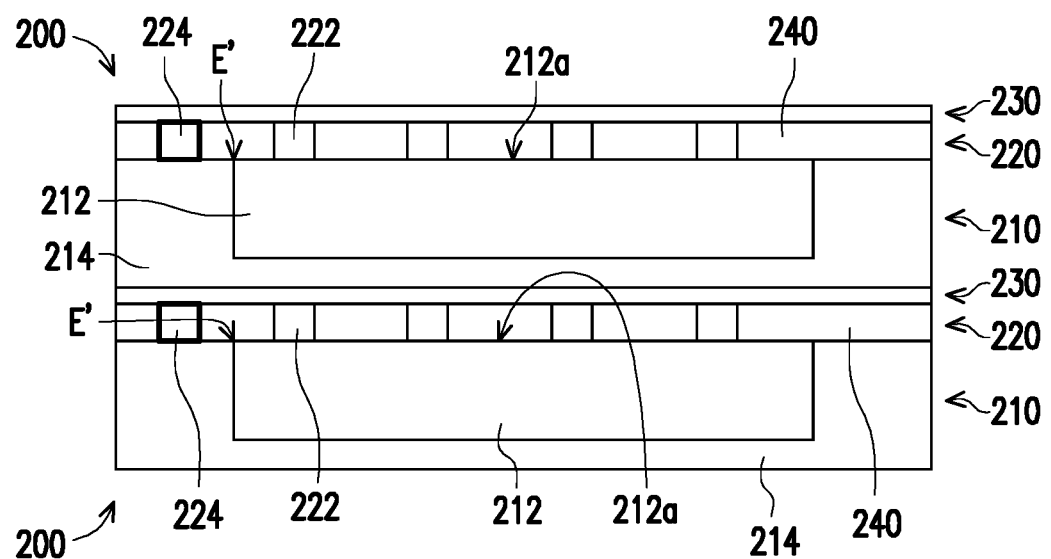
FIG. 12 is a cross-sectional view of a chip package structure according to another exemplary embodiment of the disclosure.

FIG. 12 is a cross-sectional view of a chip package structure according to another exemplary embodiment of the disclosure. A difference between the embodiment of FIG. 12 and the embodiment of FIG. 8A includes that the redistribution layer 230 of the chip package structure 200 carries another one of the chip package structure 200 and thus constitutes a package on package (POP) module.

Figure 13:
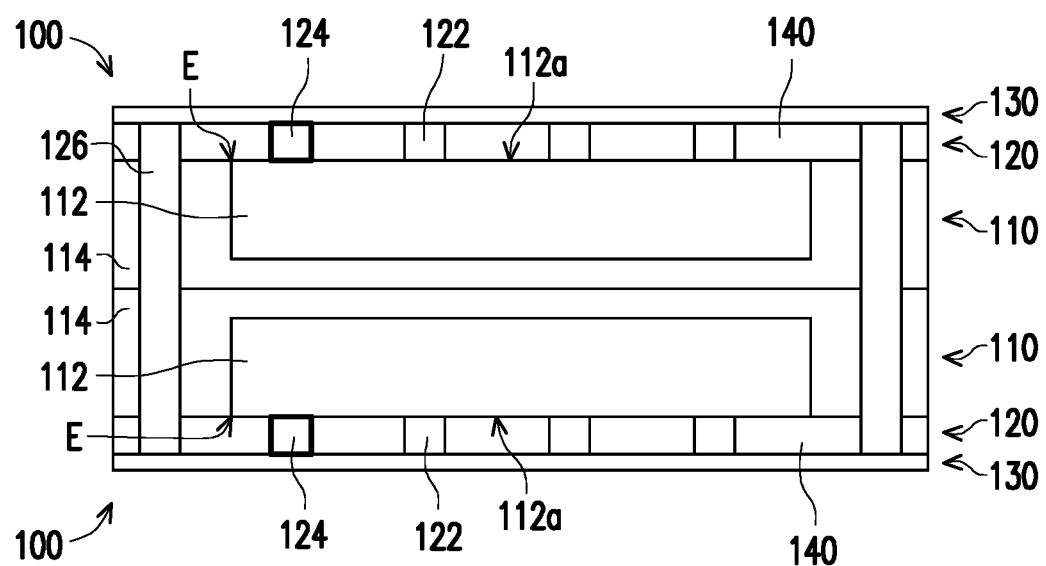
FIG. 13 is a cross-sectional view of a chip package structure according to another exemplary embodiment of the disclosure.

FIG. 13 is a cross-sectional view of a chip package structure according to another exemplary embodiment of the disclosure. A difference between the embodiment of FIG. 13 and the embodiment of FIG. 4 includes that the two chip package structures 100 of FIG. 13 are stacked in a back-to-back manner.

It will be apparent to those skilled in the art that various modifications and variations can be made to the disclosed embodiments. It is intended that the specification and examples be considered as exemplary only, with a scope of the disclosure being indicated by the following claims and their equivalents.

The invention claimed is:

1. A chip package structure, comprising:
a chip package layer, comprising at least one chip and an encapsulant, wherein the at least one chip has an upper surface, and the encapsulant encapsulates the at least one chip and exposes the upper surface; and
at least one conductive structure layer, comprising a plurality of first conductive pillars and a plurality of second conductive pillars, wherein the first conductive pillars are disposed on the upper surface, the second conductive pillars are disposed on the upper surface, the second conductive pillars are located between an edge of the upper surface and the first conductive pillars, and a density of the second conductive pillars along an extending direction of the edge is greater than or equal to 1.2 times of a density of the first conductive pillars along the extending direction of the edge,
wherein the first conductive pillars constitute a first conductive pillar array, the second conductive pillars constitute a second conductive pillar array including only one column, and the first conductive pillar array and the second conductive pillar array are arranged adjacent to each other without any conductive pillar therebetween,
wherein the density of the second conductive pillars is volume of the second conductive pillars per unit area, and the density of the first conductive pillars is volume of the first conductive pillars per unit area.

2. The chip package structure as claimed in claim 1, wherein a number of the second conductive pillars is greater than a number of the first conductive pillars of each of the columns of the first conductive pillar array.

3. The chip package structure as claimed in claim 1, wherein the density of the second conductive pillars along the extending direction of the edge is greater than or equal to 1.75 times of the density of the first conductive pillars along the extending direction of the edge.

4. The chip package structure as claimed in claim 1, wherein an outer diameter of each of the second conductive pillars along a direction perpendicular to the edge is greater than 1.2 times of an outer diameter of each of the first conductive pillars along the direction perpendicular to the edge.

5. The chip package structure as claimed in claim 1, wherein an outer diameter of each of the second conductive pillars along a direction perpendicular to the edge is greater than 1.2 times of an outer diameter of each of the second conductive pillars along a direction parallel to the edge.

6. The chip package structure as claimed in claim 1, comprising a redistribution layer disposed on the at least one conductive structure layer.

7. The chip package structure as claimed in claim 6, comprising an under fill material, wherein the under fill material is disposed between the chip package layer and the redistribution layer and encapsulates the first conductive pillars and the second conductive pillars.

8. The chip package structure as claimed in claim 6, wherein the redistribution layer carries another one of the chip package structure and constitutes a package on package module.

9. The chip package structure as claimed in claim 1, wherein a number of the at least one chip is plural, a number of the at least one conductive structure layer is plural, and the conductive structure layers respectively correspond to the chips.

10. A chip package structure, comprising:
a chip package layer, comprising at least one chip and an encapsulant, wherein the at least one chip has a first upper surface, the encapsulant encapsulates the at least one chip and exposes the first upper surface, the encapsulant has a second upper surface, and the first upper surface and the second upper surface are coplanar; and
at least one conductive structure layer, comprising a plurality of first conductive pillars and a plurality of second conductive pillars, wherein the first conductive pillars are disposed on the first upper surface, the second conductive pillars are disposed on the second upper surface and located outside the at least one chip, an edge of the first upper surface is located between the second conductive pillars and the first conductive pillars, and the second conductive pillars are arranged along an extending direction of the edge, wherein the first conductive pillars constitute a first conductive pillar array, the second conductive pillars are arranged along a column direction of the first conductive pillar array, and a first column of the first conductive pillar array is located between the second conductive pillars and a second column of the first conductive pillar array, wherein a distance between the second conductive pillars and the first column of the first conductive pillar array is less than a distance between the first column of the first conductive pillar array and the second column of the first conductive pillar array.

11. The chip package structure as claimed in claim 10, wherein a distance between the second conductive pillars and the first column of the first conductive pillar array is equal to a distance between the first column of the first conductive pillar array and the second column of the first conductive pillar array.

12. The chip package structure as claimed in claim 10, comprising a redistribution layer disposed on the at least one conductive structure layer.

13. The chip package structure as claimed in claim 12, comprising an under fill material, wherein the under fill material is disposed between the chip package layer and the redistribution layer and encapsulates the first conductive pillars and the second conductive pillars.

14. The chip package structure as claimed in claim 12, wherein the redistribution layer carries another one of the chip package structure and constitutes a package on package module.

15. The chip package structure as claimed in claim 10, wherein a number of the at least one chip is plural, a number of the at least one conductive structure layer is plural, and the conductive structure layers respectively correspond to the chips.

* * * * *